(12) United States Patent
Yutuc et al.

(10) Patent No.: US 9,159,603 B1
(45) Date of Patent: Oct. 13, 2015

(54) INTEGRATED CIRCUIT PACKAGE STRIP SUPPORT ASSEMBLY

(71) Applicant: Texas Instruments Incorporated, Dallas, TX (US)

(72) Inventors: Joseph Cruz Yutuc, Baguio (PH); Leody Navarro Olivares, Baguio (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/449,950

(22) Filed: Aug. 1, 2014

(51) Int. Cl.
*H01L 21/68* (2006.01)
*H01L 21/687* (2006.01)

(52) U.S. Cl.
CPC ........ *H01L 21/687* (2013.01); *H01L 21/68707* (2013.01)

(58) Field of Classification Search
CPC .................................................. H01L 21/6838
See application file for complete search history.

(56) References Cited

U.S. PATENT DOCUMENTS

| 3,490,096 | A | * | 1/1970 | Johnson ........................ 425/501 |
| 6,661,080 | B1 | | 12/2003 | Glenn et al. |
| 2003/0116152 | A1 | | 6/2003 | Cheung et al. |
| 2008/0003718 | A1 | | 1/2008 | Estepa et al. |

OTHER PUBLICATIONS

Albalak, Dr. Ramon J.; "Package Singulation Processes", Information Communication Technology, 2 pages.
Abeyta, Bill; "Step 11: The back-end process: Singulation step by step," Solid State Technology Insights for Electronics Manufacturing, http://electroiq.com/blog/2000/11/step-11-the-back-end-process-singulation-step-by-step, 5 pages.

\* cited by examiner

*Primary Examiner* — Roy Potter
*Assistant Examiner* — Paul Patton
(74) *Attorney, Agent, or Firm* — Steven A. Shaw; Charles A. Brill; Frank D. Cimino

(57) ABSTRACT

An integrated circuit ("IC") package strip support assembly for a saw table including a first material having a first hardness and having a surface adapted to engage a first surface of an IC package strip during sawing; and a second material having a second hardness and having a surface adapted to engage the first surface of the IC package strip during sawing wherein the second hardness is less than the first hardness.

20 Claims, 7 Drawing Sheets

INTEGRATED CIRCUIT PACKAGE STRIP SUPPORT ASSEMBLY

BACKGROUND

Integrated circuit ("IC") packages typically comprise at least one IC die mounted on a substrate, such as a lead frame. The die and substrate are generally encapsulated in a block of protective mold compound. Electrical leads or other electrical contact surfaces that are not encapsulated in mold compound enable the IC package to be connected to other electrical circuitry such as, for example, by connecting the IC package leads to contact surfaces of a printed circuit board.

IC packages are generally formed in IC package "strips" that include a plurality of interconnected lead frames and associated dies that have been encapsulated in mold compound. The individual IC packages are separated in a process known as singulation. During singulation, a saw or laser cuts the lead frame strip along "saw streets" arranged in a rectangular grid to create the individual IC packages.

One popular type of IC package is known as a ball grid array or "BGA." A BGA package has a grid of solder balls mounted on a substrate at the bottom of the package. To attach a BGA package to a circuit board, the solder balls are bonded under heat and pressure to the corresponding contact surfaces of the circuit board. A BGA strip is a group of integrally connected BGA substrates having dies mounted on and electrically connected to each BGA leadframe on the strip. The BGA strip further includes a block of encapsulating mold compound that covers the interconnected leadframes and dies mounted thereon except for the BGA arrays on the bottom of each of the BGA leadframes.

DETAILED DESCRIPTION

Figure 10:
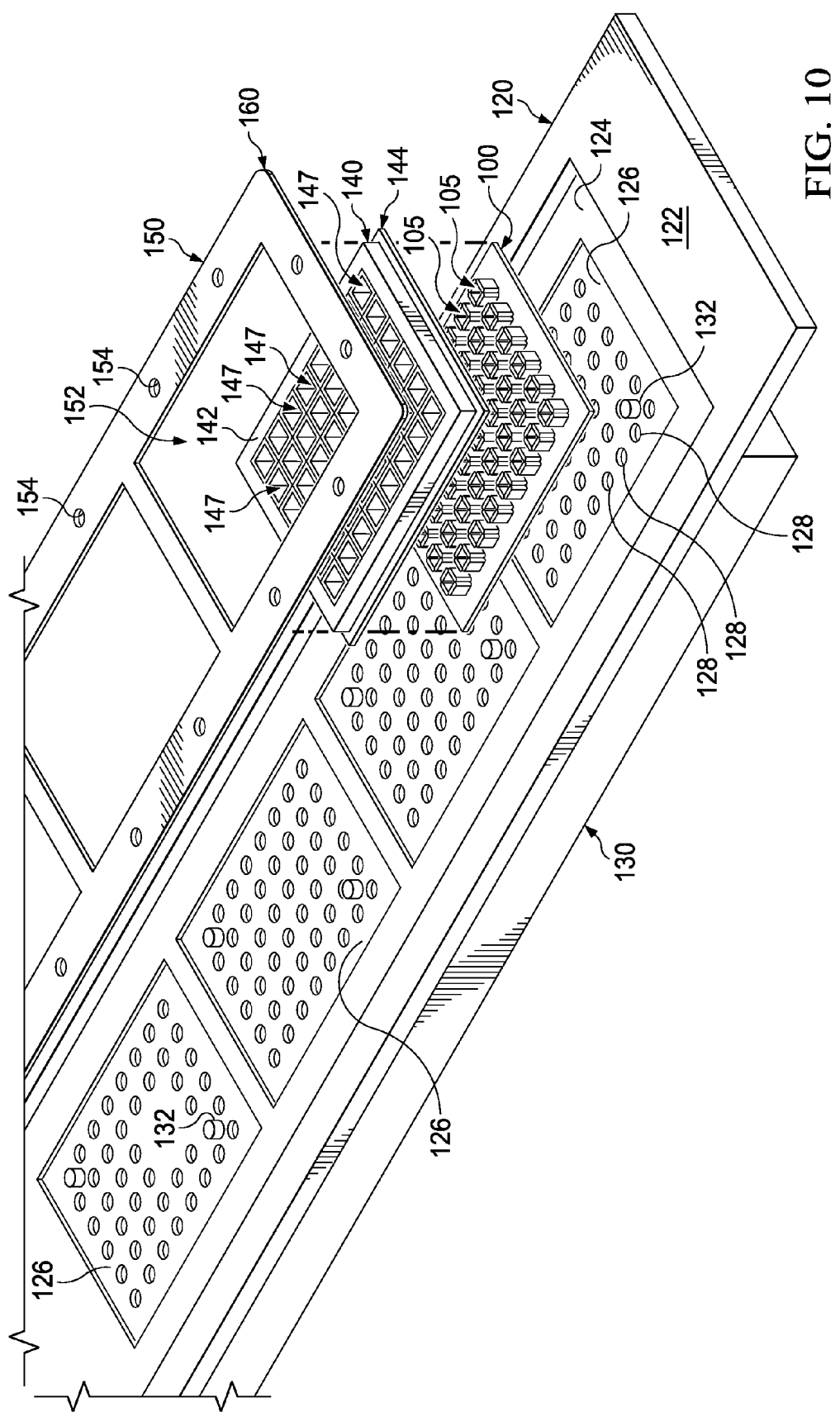
FIG. 10 is an exploded isometric view of an insert assembly and support plate that are to be mounted on a saw table.
Figure 11:
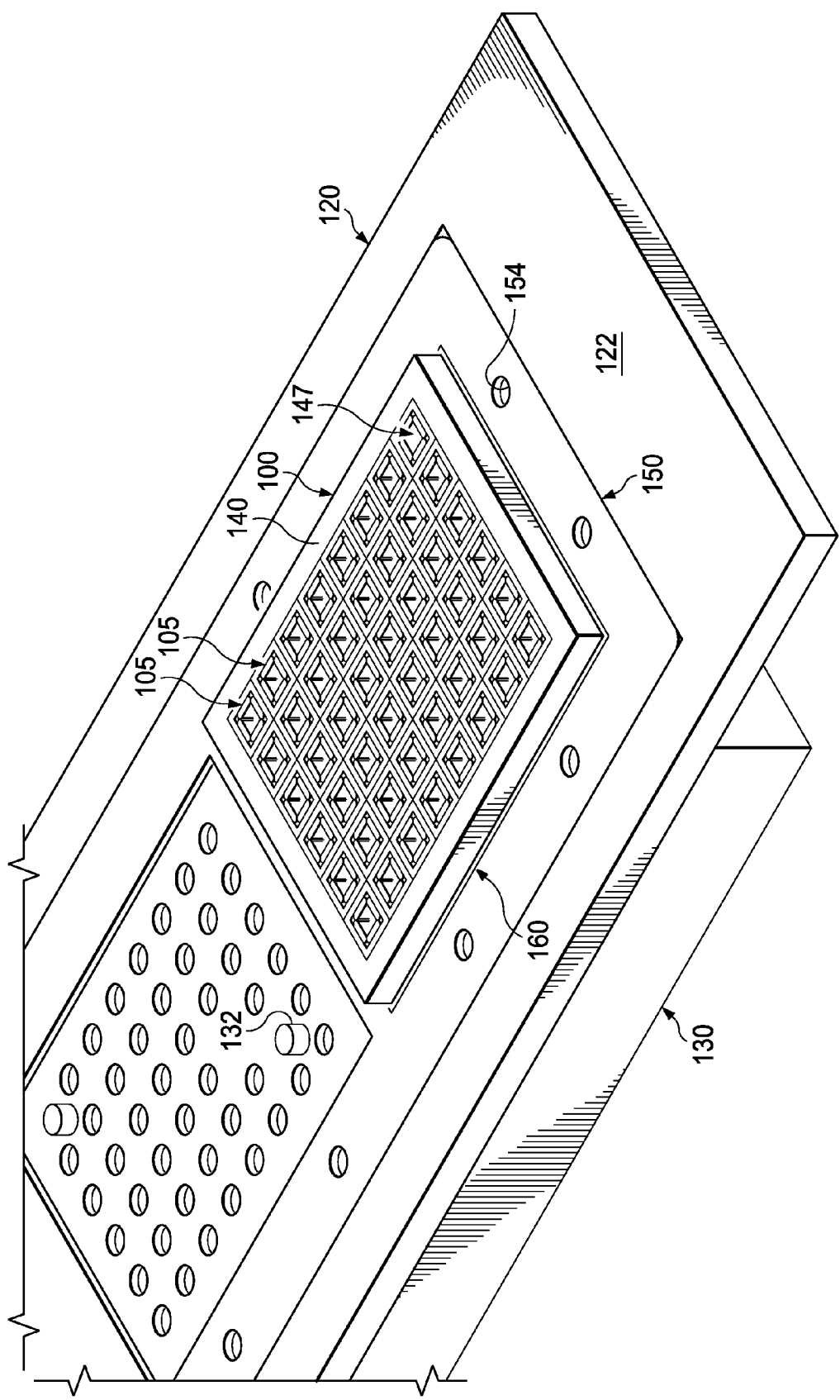
FIG. 11 is an assembled isometric view of the structures shown in FIG. 10.

This specification, in general, discloses an integrated circuit ("IC") package strip support assembly 160 for a saw table 120, FIGS. 10 and 11. The support assembly 160 includes a vacuum source 130. It also includes a support plate 140 having a first surface 141 adapted to engage a first surface 181 of the package strip 180, FIG. 13. The support plate 140 has a plurality of holes 147 in fluid communication with the vacuum source 130 and is made from a first material having a first hardness. A plurality of inserts 106 are adapted to be received in the holes 147 in the support plate 140, FIG. 12. The plurality of inserts 106 are constructed from a second material having a second hardness less than the first hardness. Having thus generally described an integrated circuit ("IC") package strip support assembly 160 for a saw table 120, the support assembly 160 and methods of use thereof will now be described in detail.

Figure 1:
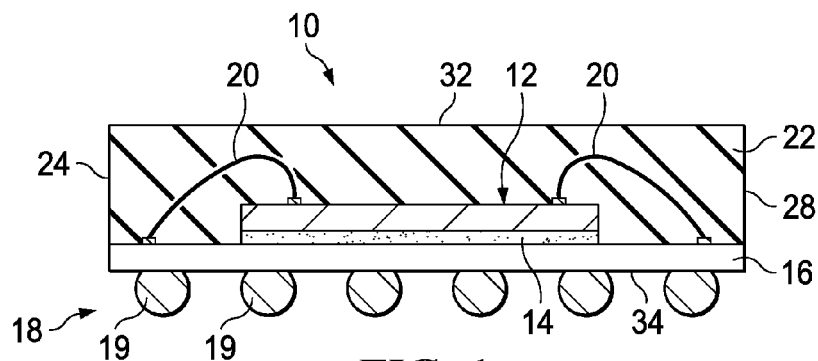
FIG. 1 is a cross-sectional elevation view of a prior art BGA package.
Figure 2:
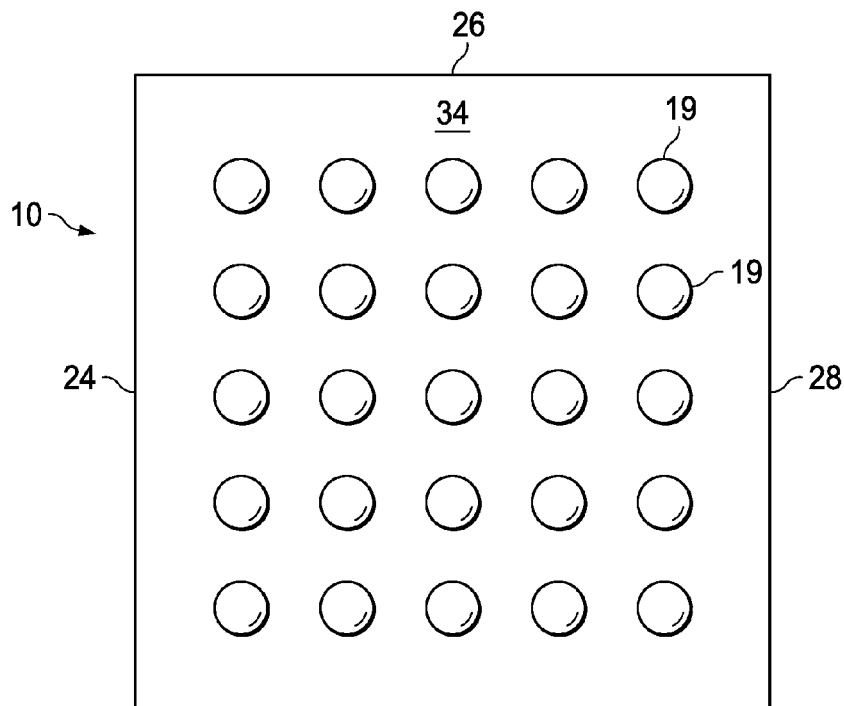
FIG. 2 is a bottom plan view of the BGA package of FIG. 1.
Figure 3:
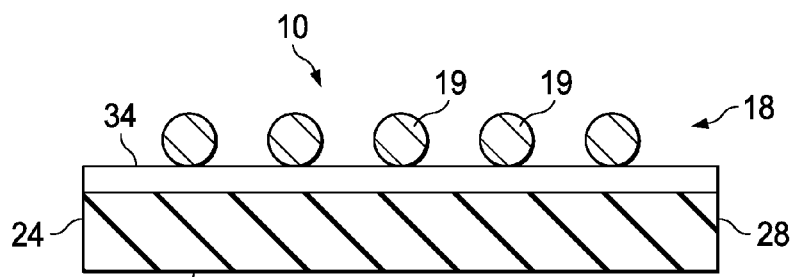
FIG. 3 is a side elevation view of the BGA package of FIG. 1, in an inverted position with respect to FIG. 1.

FIGS. 1-3 illustrate a conventional, prior art BGA type IC package 10. As shown in cross-section in FIG. 1, a conventional IC package 10 may include an IC die 12 attached by an adhesive layer 14 to a substrate 16. The substrate is a BGA type substrate having a BGA 18 that comprises a plurality of solder balls 19 attached to one surface 34 thereof. A plurality of bond wires 20 electrically connect contact surfaces on the die 12 to the BGA 18. The die 12, bond wires 20 and one surface of the substrate 16 are covered with mold compound 22, which solidifies into a hard epoxy block having a top surface 32. As best shown by FIG. 2, the IC package 10 has a first lateral side 24, a second lateral side 26, a third lateral side 28 and a fourth lateral side 30. The IC package 10 ideally has opposite lateral sides 24, 28 and 26, 30 that are parallel.

Figure 4:
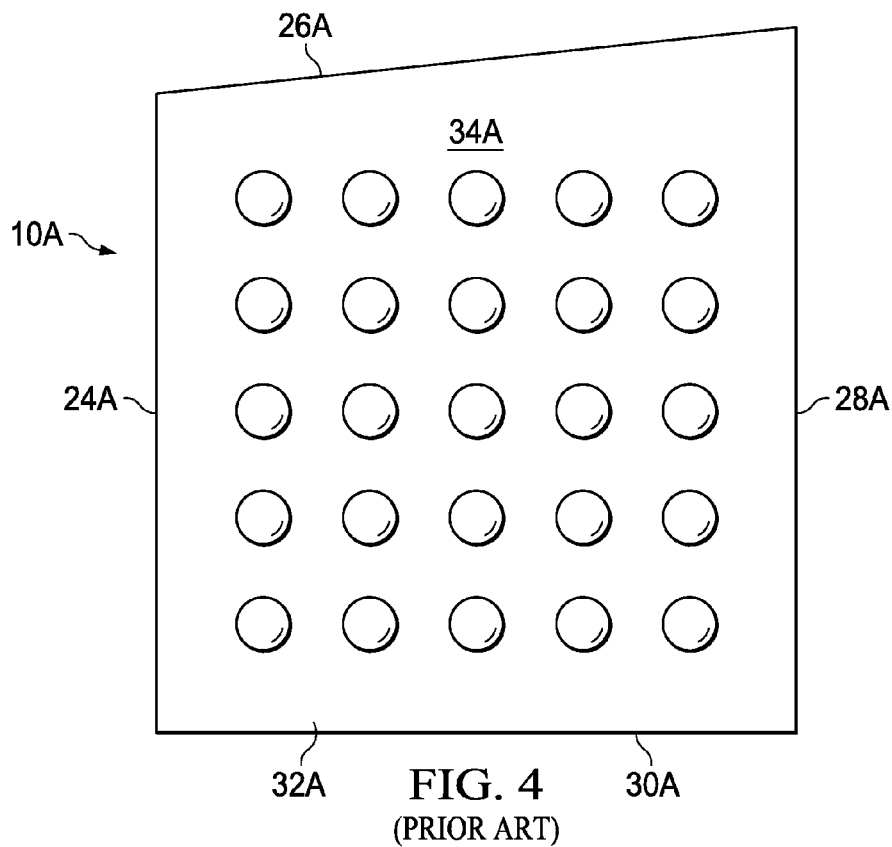
FIG. 4 is a top plan view of a BGA package of the general type illustrated in FIGS. 1-3, in which two opposite sides of the package are in a skewed relationship.

FIG. 4 is a top plan view of a defective prior art IC package 10A. IC package 10A is essentially identical to IC package 10, except that two of its lateral sides 26A and 30A are not parallel and thus the IC package 10A has an undesirable, generally trapezoidal shape.

Figure 5:
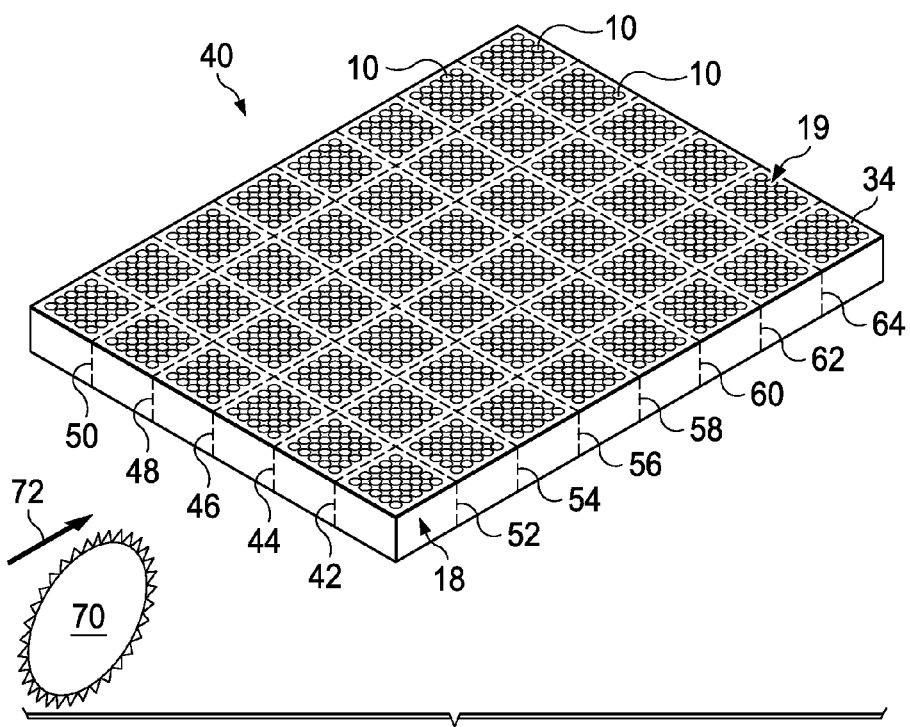
FIG. 5 is a schematic top isometric view of an IC package strip showing saw streets along which the IC package strip will be severed.

FIG. 5 is a top isometric view of a die mounted, wire bonded and encapsulated BGA strip 40 having a grid of saw streets 42-64 that will be cut with a dicing saw 70 moving in predetermined directions. For example, in order to cut saw street 42, the saw will move in linear direction 72.

Figure 6:
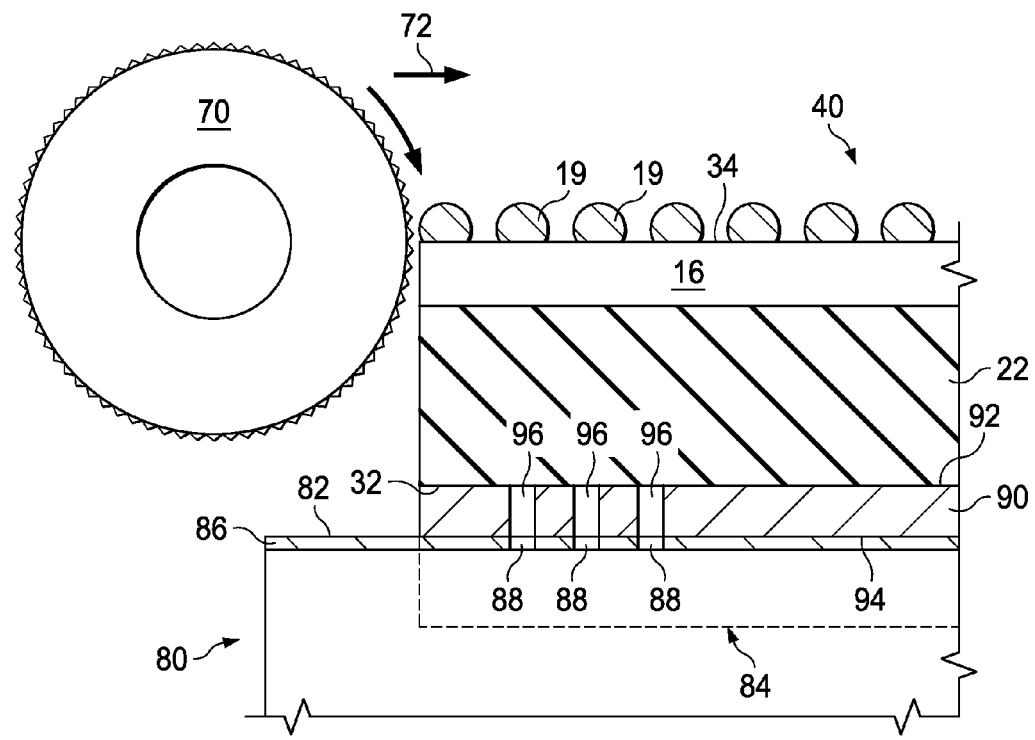
FIG. 6 is a schematic side elevation view of a prior art IC package strip singulation assembly.

FIG. 6 is a schematic side elevation view of a BGA strip 40 being singulated on a prior art saw table 80. The saw table 80 has a top surface 82. A vacuum assembly 84 provides vacuum to an enclosed region beneath the saw tabletop surface 82. Vacuum assembly 84 may comprise a vacuum cover plate 86 having holes 88 therein. Cover plate 86 may be contiguous with the top surface 82 of the saw table 80 or may form part of the top surface 82 of the saw table 80.

Figure 7:
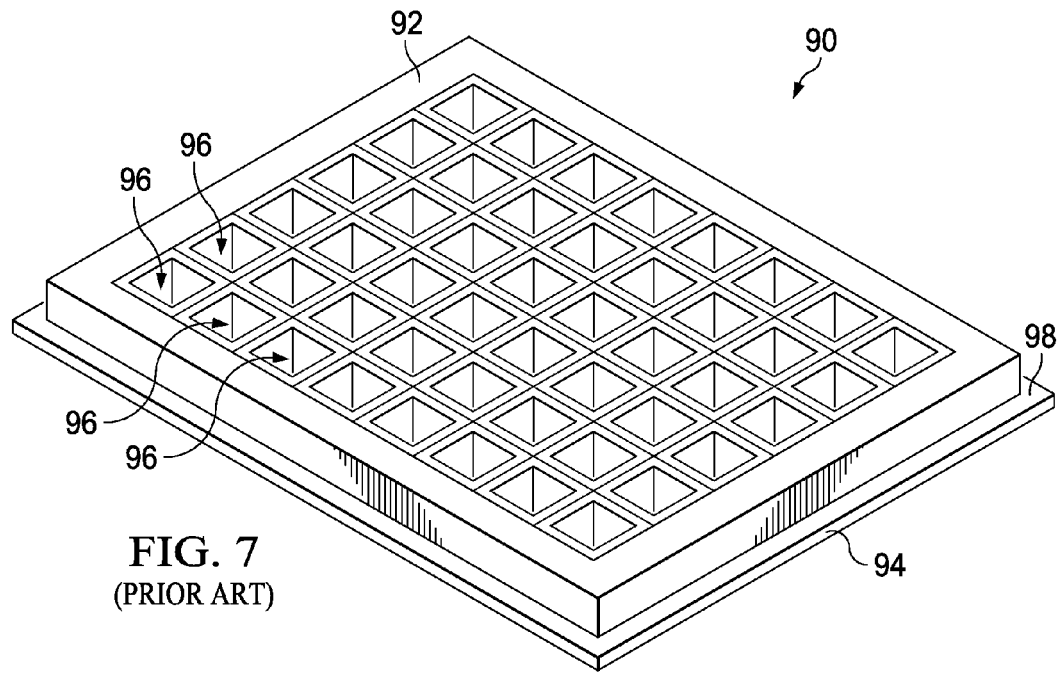
FIG. 7 is an isometric view of a prior art IC package strip support plate for a saw table.

As further shown by FIG. 6, an IC strip support plate 90 may be supported on the cover plate 86. An isometric view of the support plate 90 is shown in FIG. 7. The IC strip support plate 90 has a top portion 92, having a bottom portion 94 and a plurality of holes 96 extending from the top to the bottom portions thereof. Support plate 90 also has a bottom peripheral rim 98 which facilitates attachment thereof to the saw table 80. The support plate 90 is mounted on the table 80 with the holes 96 thereof positioned in alignment with the holes 88 in the vacuum cover plate 86. The support plate 90 is constructed from a material such as an extruded chuck rubber material that has a first hardness, for example 70 shore A.

In operation, an IC package strip 40, such as shown in FIGS. 5 and 6, is supported on the support plate 90 and vacuum applied through the aligned holes 88 and 96 holds the IC package strip 40 in engagement with the support plate 90. No other holding forces or clamps are applied to the IC package strip 40. In most cases the material from which the support plate 90 is constructed provides sufficient friction when engaged with the molded portion of an IC package strip, such as strip 40, that the package strip remains stationary as the saw 70 cuts along the various saw streets 42, 44, etc. However, in some cases, when the molded portion of the IC package strip is made from a material with a smoother/slicker surface, the friction force is not sufficient to prevent movement of the IC package strip relative the support plate 90 during sawing. Such movement produces various defects in IC packages, such as the trapezoid shape shown in FIG. 4.

Figure 8:
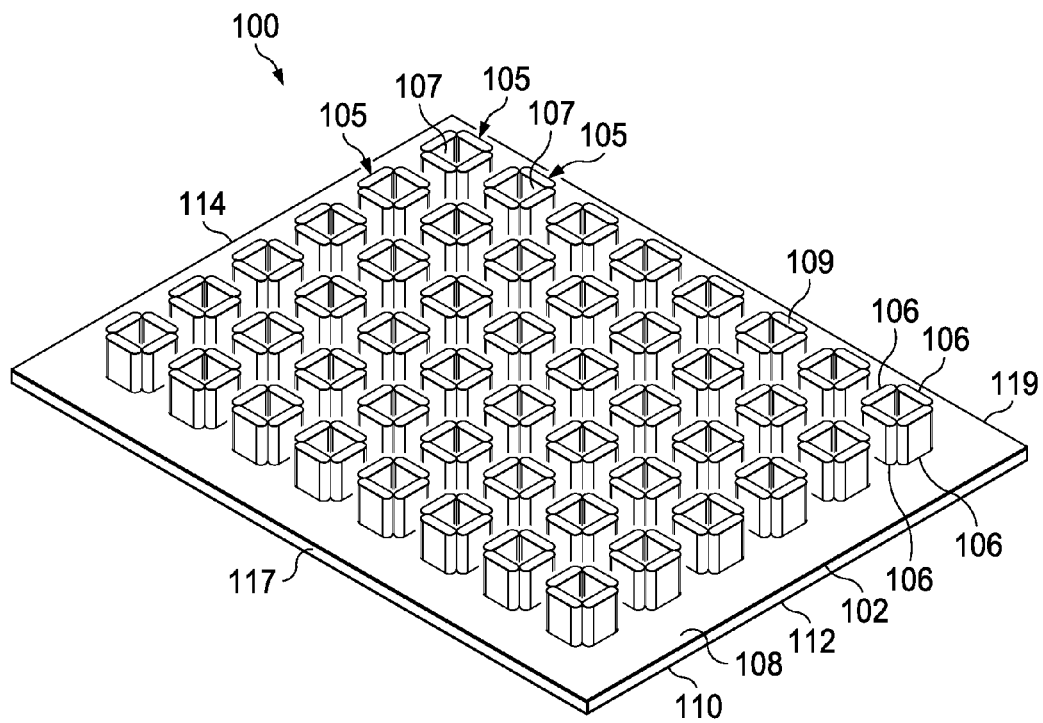
FIG. 8 is an isometric top view of an insert assembly.
Figure 9:
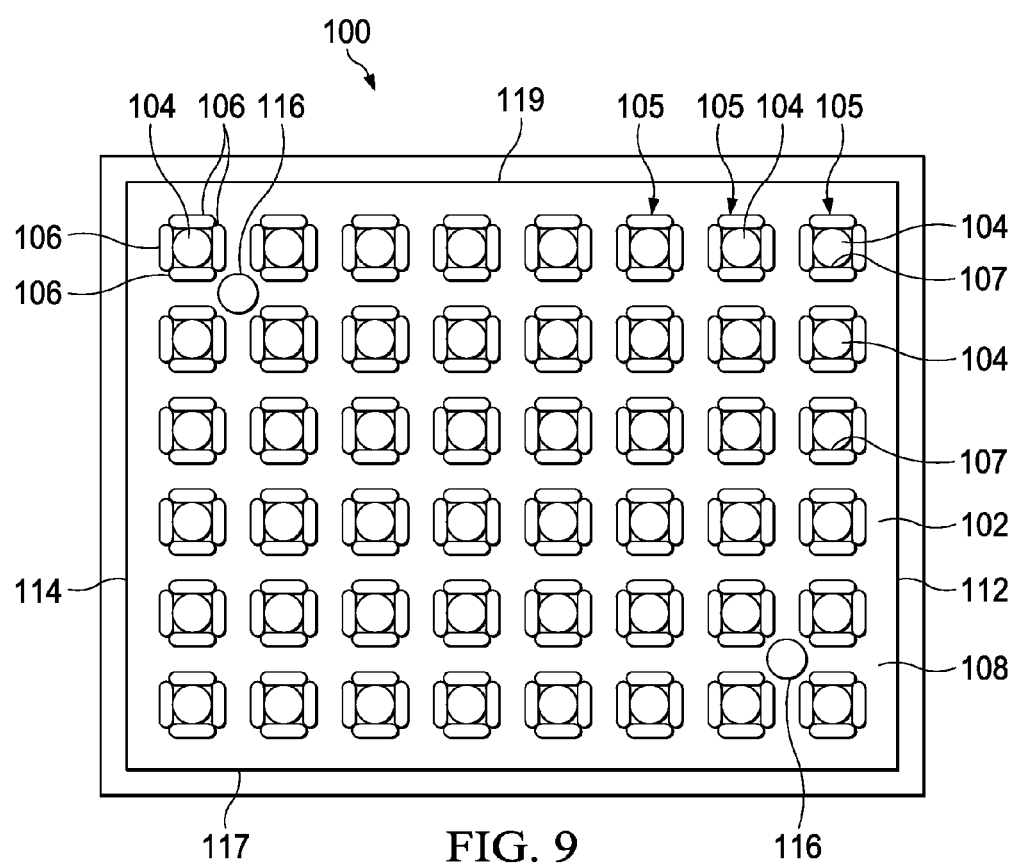
FIG. 9 is a top plan view of the insert assembly of FIG. 8.
Figure 9A:
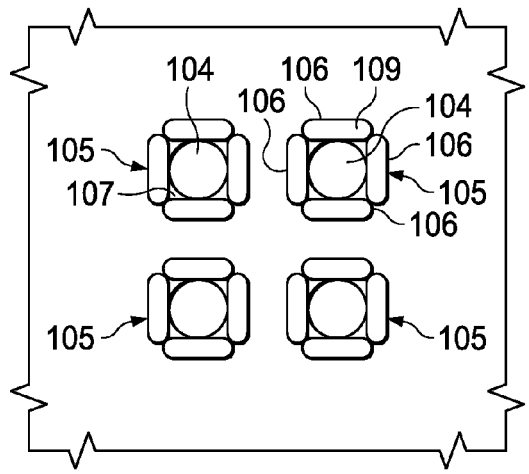
FIG. 9A is a detail view of the insert assembly of FIG. 9.

FIGS. 8 and 9 illustrate an insert assembly 100 that includes an insert holder plate 102 having a plurality of holes 104 therein arranged in a grid. A plurality of resiliently deformable insert clusters 105, are mounted around the plurality of holes 104. In this embodiment, an insert cluster 105 comprises four identical inserts 106 which are attached to the plate 102 and project upwardly therefrom. A detail of the insert clusters 105 is shown by FIG. 9A. In the illustrated embodiment, the inserts 106 are arranged to form a square passage 107. The inserts 106 are made from a material, for example an anti-slip rubber or synthetic rubber compound such as polyacrylate or silicone, having a hardness, for example, 30-40 shore A, that is less than the hardness of the material forming the support plate 140. It will be understood by those skilled in the art that a smooth surfaced rubber compound having a greater hardness will have a lower coefficient of friction than a smooth surfaced rubber compound with a relatively lower hardness. Thus, frictional forces, which resist movement of an encapsulated leadframe strip supported on a smooth support surface made from a higher hardness material will be less than the frictional forces generated when the leadframe strip is supported by a smooth support surface made from a material with a relatively lower hardness.

Figure 12:
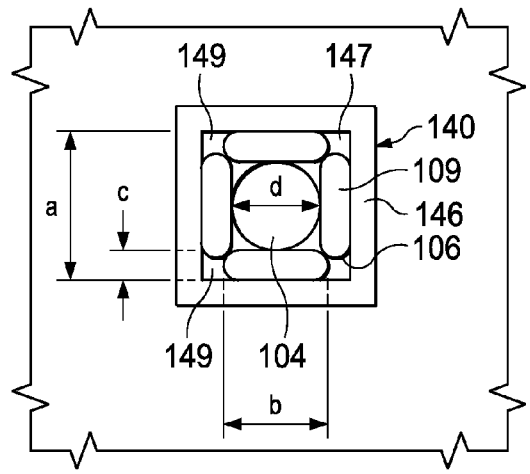
FIG. 12 is a detail top view of FIG. 11.

Insert holder plate 102, has a top portion 108, a bottom portion 110, a front edge portion 112, back edge portion 114, and two lateral side portions 117, 119. The insert holder plate 102 may be of an identical size and shape as that of an associated IC package support plate 140, FIGS. 10 and 11. In addition to the vacuum transmitting holes 104, a plurality of fastener holes 116 are provided on the insert holder plate 102 to facilitate attachment of the insert holder plate 102 to an associated saw table 120. The insert assembly 100 is adapted to have the insert clusters 105 thereon received by holes 147 in an IC package strip support plate 140, FIGS. 10 and 11, which may be similar or identical to the prior art support plate 90 described with reference to FIG. 7. The radially outer surfaces of the inserts 106 engage the surfaces of the support plate that define the holes 107 therein. FIG. 12 shows a detail of inserts 106 received within a hole 147 of support plate 140. It may be seen that a plurality of voids 149 may be formed between the inserts 106 and the walls defining support plate holes 147. In one example embodiment, the dimensions shown in FIG. 12 are as follows: a=4.2 mm, b=2.79 mm, c=0.79 mm, d=2.5 mm. In will be seen from FIG. 12 that the plurality of holes 147 in the support plate 140 each have a cross sectional shape of a first geometric figure, e.g., a square, with a first cross sectional open area, e.g., about $a^2$, and wherein the inserts 106 are received in the holes 147 and arranged in a configuration having a cross sectional shape generally the same as said first geometric figure, e.g., a square, and having a second internal area, e.g., about $b^2$, less than the first internal area.

As shown in FIGS. 10 and 11, a saw table 120 has a top portion 122 with a rectangular frame shaped recessed area 124 therein. A series of rectangular recessed areas 126 may be positioned within the rectangular frame shaped recessed area 124. A plurality of holes 128 may be arranged in a grid within each rectangular area 126. A vacuum assembly 130 is in fluid communication with the plurality of holes 128. The vacuum assembly 130 may be a conventional vacuum assembly such as used with saw tables in the prior art. A plurality of bolts, screws 132 or other fasteners may be used to attach the insert holder plate 102 to the rectangular recessed area 126 with the holes 104 in the plate 102 aligned with the holes 128 in the rectangular recessed areas 126. The manner by which the IC strip support plate 140 and insert assembly 100 are mounted on the saw table 120 will now be described.

Initially the insert clusters 105 on the insert holder plate 102 are inserted in corresponding holes 147 in the strip support plate 140, as shown generally by FIG. 10. Then a rectangular attachment frame 150 having a central opening 152 therein is positioned around a central body portion 142 of the IC strip support plate 140 with the bottom peripheral rim 144 of the support plate 140 engaged by the rectangular attachment frame 150. The frame 150 is then bolt/screw attached to the saw table as through use of holes 154, etc.

Figure 13:
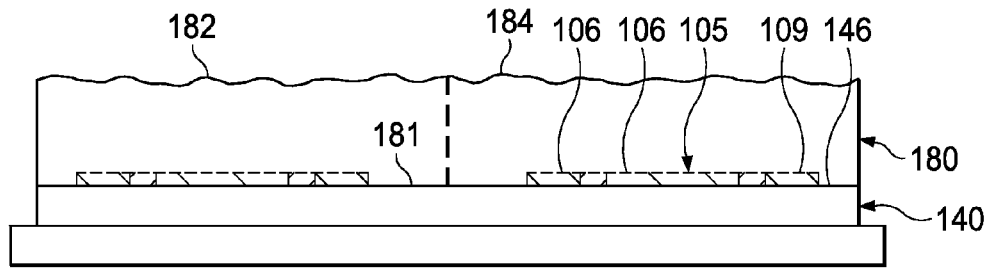
FIG. 13 is a detail side elevation view of FIG. 11.

The insert assembly 100 and support plate 140 thus form a compound IC package strip support assembly 160, FIG. 11, which is held in fixed relationship with the saw table 120. Fluid passageways extending through this compound assembly 160 transmit vacuum force to an IC package strip 180 that is supported thereon, FIG. 13. In the embodiment shown in FIG. 13, there is one resiliently deformable insert cluster 105 positioned below each portion 182, 184 of an IC package strip 180 that ultimately becomes a separate IC package, such as IC package 10 shown in FIGS. 1-3. As shown by FIG. 13, each insert cluster 105 projects a small distance, e.g. 10 um-20 um above a top surface 146 of the support plate 140 when there is no IC package strip 180 supported by the support plate 140. The top surface of each insert cluster 105, when it is in this upwardly projected state, is shown in dashed lines in FIG. 13. The inserts 106 are sufficiently soft and resilient that when vacuum force is applied to a package strip 180, the inserts 106 are compressed by the package strip 180 so that the tops of the inserts 106 are flush with the support plate top surface 146. As a result, the friction force that opposes any lateral movement of the IC package strip 180 is comprised of a first component associated with frictional contact between the support plate 140 and the package strip 180 and a second frictional component that is associated with contact between the insert clusters 105 and the package strip 180. Because of the lower hardness and associated higher coefficient of friction of the material from which the insert clusters 105 are formed, a relatively greater frictional movement resistance force per unit area is provided thereby. The friction values produced by the contacting materials are selected such that the total friction force generated is sufficient to hold even a relatively smooth slick surface package strip 40 in nonmoving relationship with the saw 70 during singulation. When IC package strips 40 made from rougher/less slippery surface material is to be singulated, the insert assembly 100 may be removed to preserve the life of the relatively softer inserts 106 thereof. Thus a relatively inexpensive assembly may be provided to solve the problem of package strip movement during singulation. This assembly obviates the need for more powerful vacuum assemblies by taking advantage of increased friction force rather than higher vacuum loading with its increased risk of damage to the packaging strips 40 or 180.

Figure 14:
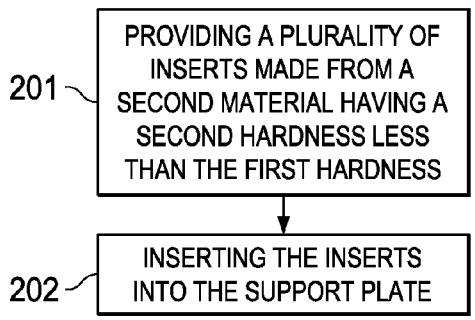
FIG. 14 is a flow chart of a method of modifying an integrated circuit ("IC") package strip support assembly for a saw table.

FIG. 14 illustrates a method of modifying an integrated circuit ("IC") package strip support assembly for a saw table. The saw table is of the type that includes a vacuum source and a support plate made from a first material. The support plate has a first surface adapted to engage a first surface of an IC package strip, and has a plurality of holes in it that are in fluid communication with the vacuum source. These holes are adapted to be aligned with predetermined portions of the IC package strip. The support plate is constructed from a first material having a first hardness. The vacuum force generated by the vacuum source is sufficiently strong to prevent movement of the IC package strip during sawing when the IC package strip is encapsulated in the first material having the a first relatively higher friction mold compound. However, the vacuum force is not sufficiently strong to prevent movement of the IC package strip during sawing when the IC package strip is encapsulated in a second relatively lower friction mold compound.

The method includes, as shown at 201 of FIG. 14, providing a plurality of inserts made from a second material having a second hardness, which is less than the first hardness. The method further includes, as shown at 202, inserting the inserts into the support plate.

Although certain embodiments of an integrated circuit ("IC") package strip support assembly for a saw table and a method for making such an assembly have been described in detail herein, other embodiments of such support assemblies and methods will become obvious to those skilled in the art after reading this disclosure. It is intended that the appended claims be broadly construed so as to cover such alternative embodiments, except to the extent limited by the prior art.

What is claimed is:

1. An integrated circuit ("IC") package strip support assembly for a saw table comprising:
    a vacuum source;
    a support plate having a first surface adapted to engage a first surface of said IC package strip, said support plate comprising a plurality of holes in fluid communication with said vacuum source and being constructed from a first material having a first hardness; and
    a plurality of inserts adapted to be received in said plurality of holes in said support plate, said plurality of inserts constructed from a second material having a second hardness less than said first hardness.

2. The support assembly of claim 1 wherein said plurality of inserts extend outwardly from said first surface of said support plate in a first operating position of said inserts.

3. The support assembly of claim 2 wherein said plurality of inserts are substantially flush with said first surface of said support plate in a second operating position of said inserts.

4. The support assembly of claim 3 wherein said plurality of inserts are resiliently deformable between said first operating position and said second operating position.

5. The support assembly of claim 1 wherein said plurality of inserts are mounted on an insert holder plate and extend outwardly therefrom.

6. The support assembly of claim 1 wherein said plurality of holes in said support plate each have a cross sectional shape of a first geometric figure with a first internal open area and wherein said inserts are received in said holes and arranged in a configuration having a cross sectional shape generally the same as said first geometric figure and having a second internal area less than said first internal area.

7. The support assembly of claim 6 wherein said plurality of holes in said support plate have a cross sectional shape with a cross sectional area less than said second internal area.

8. The support assembly of claim 6 wherein said inserts comprise radially outer surfaces that engage surfaces of said support plate defining said plurality of holes therein.

9. The support assembly of claim 8, wherein said radially outer surfaces of said inserts and corresponding hole defining surfaces of said support plate define a plurality of gaps therebetween.

10. The support assembly of claim 6 wherein said plurality of inserts are mounted on an insert holder plate.

11. The support assembly of claim 1 wherein said vacuum source comprises a vacuum plate having a plurality of holes therein that are aligned with said plurality of holes in said support plate.

12. The support assembly of claim 11 wherein said plurality of inserts are mounted on an insert holder plate and wherein said insert holder plate is positioned between said vacuum plate and said support plate and wherein said insert holder plate comprises a plurality of holes therein aligned with said plurality of holes in said vacuum plate and said plurality of holes in said support plate.

13. An integrated circuit ("IC") package strip support assembly for a saw table comprising:
    a first material having a first hardness and having a surface adapted to engage a first surface of an IC package strip during sawing; and
    a second material having a second hardness and having a surface adapted to engage said first surface of said IC package strip during sawing, said second hardness being less than said first hardness.

14. The support assembly of claim 13 further comprising a vacuum assembly adapted to apply a predetermined vacuum holding force at a plurality of predetermined locations on an IC package strip supported on said support assembly.

15. The support assembly of claim 14 wherein said vacuum holding force is sufficiently strong to create a frictional resistance between said IC package strip and said first material to prevent movement of said IC package strip during sawing when said IC package strip is encapsulated in a first relatively higher friction mold compound and wherein said vacuum holding force is not sufficiently strong to create a frictional resistance between said IC package strip and said first material sufficient to prevent movement of said IC package strip during sawing when said IC package strip is encapsulated in a second relatively lower friction mold compound.

16. The support assembly of claim 15 wherein said vacuum source is sufficiently strong to create a combined frictional resistance between said IC package strip and said first material and said second material to prevent movement of said IC package strip when said IC package strip is encapsulated in said second relatively lower friction mold compound.

17. A method of modifying an integrated circuit ("IC") package strip support assembly for a saw table that includes a vacuum source and a support plate made from a first material and having a first surface adapted to engage a first surface of an IC package strip, the support plate having a plurality of holes therein in fluid communication with the vacuum source and adapted to be aligned with predetermined portions of the IC package strip, the support plate constructed from a first material having a first hardness and wherein the vacuum force generated by the vacuum source is sufficiently strong to prevent movement of the IC package strip during sawing when the IC package strip is encapsulated in a first relatively higher friction mold compound and is not sufficiently strong to prevent movement of the IC package strip during sawing when the IC package strip is encapsulated in a second relatively lower friction mold compound, the method comprising:
    providing a plurality of inserts made from a second material having a second hardness less than the first hardness; and
    inserting the inserts into the support plate.

18. The method of claim 17 wherein said providing a plurality of inserts comprises providing a plurality of inserts having a length that is sufficient so that the inserts extend above the first surface of the support plate when inserted therein.

19. The method of claim 18 further comprising mounting the inserts on an insert holder plate having a plurality of holes therein and placing the insert holder plate below the support plate with the holes in the insert holder plate aligned with the holes in the support plate and the inserts extending though the holes in the support plate.

20. The method of claim 19 wherein said providing the inserts comprises providing inserts that are sufficiently soft and resilient such that applying the vacuum force when an IC package strip is supported on the support strip causes the inserts to resiliently deform to a position at which the inserts are flush with the first surface of the support strip such that the inserts and the support plate both apply frictional force to the support plate to prevent the support plate from moving during sawing thereof.

* * * * *